Figure 1:
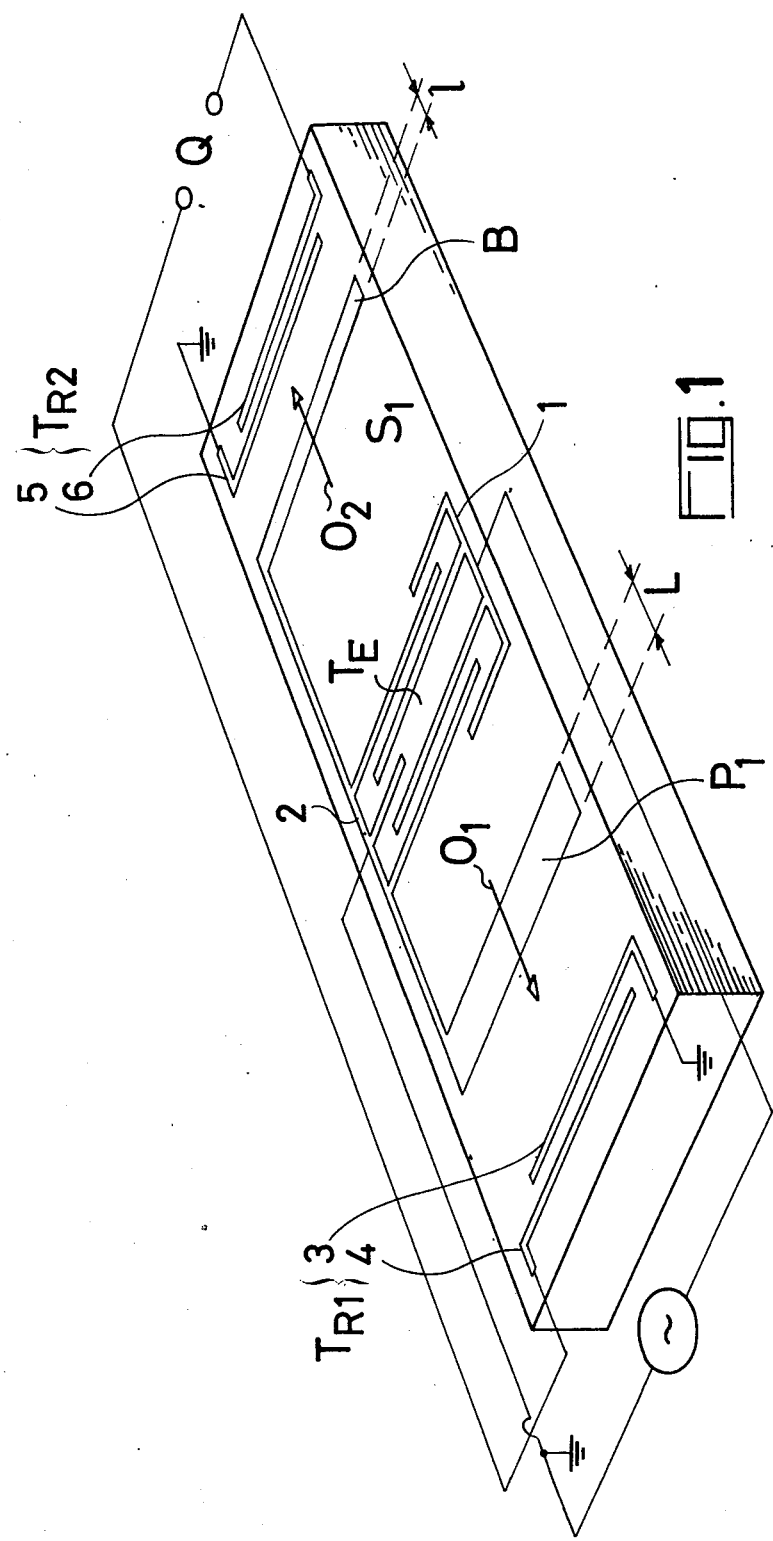

United States Patent [19]

Coussot

[11] 4,025,880

[45] May 24, 1977

[54] ELASTIC SURFACE WAVE TRANSMITTING DEVICE FOR ELIMINATING MULTIPLE TRANSIT ECHOES

[75] Inventor: Gerard Coussot, Paris, France

[73] Assignee: Thomson-CSF, Paris, France

[22] Filed: Apr. 27, 1976

[21] Appl. No.: 680,678

[30] Foreign Application Priority Data

Apr. 30, 1975 France .............................. 75.13619

[52] U.S. Cl. .................. 333/72; 310/8.3; 333/30 R

[51] Int. Cl.² .................. H03H 9/04; H03H 9/26; H03H 9/32; H03H 9/30

[58] Field of Search .................. 333/30 R, 72, 71; 310/8.1, 8.2, 9.8, 8.3

[56] References Cited

UNITED STATES PATENTS

| | | | |
|---|---|---|---|
| 3,845,420 | 10/1974 | Holland et al. | 333/30 R |
| 3,868,608 | 2/1975 | Williams | 333/72 |
| 3,872,410 | 3/1975 | Zucker | 333/72 |
| 3,908,137 | 9/1975 | Hunsinger et al. | 310/8.1 |
| 3,972,011 | 7/1976 | Coussot et al. | 333/30 R |

*Primary Examiner*—Alfred E. Smith
*Assistant Examiner*—Marvin Nussbaum
*Attorney, Agent, or Firm*—Cushman, Darby & Cushman

[57] ABSTRACT

An elastic surface wave transmitting device comprising a piezoelectric substrate $S_1$ on which is arranged a transmitting transducer $T_E$ placed on the center of the substrate $S_1$, and two receiving transducers $T_{R1}$ and $T_{R2}$ arranged on either side of the transmitting transducer $T_E$, means (a metallic wafer $P_1$, for example deposited by evaporation on to the substrate $S_1$) enabling the waves transmitted by the transmitting transducer $T_E$ towards each of the receiving transducers $T_{R1}$ and $T_{R2}$ to be phase-shifted so that the waves $O_1$ and $O_2$ respectively reflected by these receiving transducers $T_{R1}$ and $T_{R2}$ cancel one another out at the transmitting transducer $T_E$.

9 Claims, 3 Drawing Figures

ELASTIC SURFACE WAVE TRANSMITTING DEVICE FOR ELIMINATING MULTIPLE TRANSIT ECHOES

This invention relates to an elastic surface wave device for eliminating multiple transit echoes, i.e. parasitic waves arising out of the repeated reflection of the principal wave at the transmitting and receiving transducers for the surface waves.

Elastic surface wave acoustic lines or filters generally comprise an input or transmitting transducer and an output or receiving transducer consisting of electrodes in the form of interdigitated combs arranged on the surface of a piezoelectric substrate.

When the input transducer receives a signal in the form of an electrical AC voltage, it transmits elastic surface waves of the Rayleigh wave type. These waves are picked up by the output transducer which transmits an output signal in the form of an electrical voltage of which the amplitude is variable according to the vibratory mode selected and the shape of the electrodes. However, the amplitude of the surface waves supplied by the filter is often disturbed by parasitic waves arising out of the repeated reflection of the principal wave at the output and input transducers. The amplitude of this reflected wave is larger, the more the transducers are adapted.

Various systems have been proposed for attenuating these parasitic waves. Unfortunately, these systems operate on a single frequency or on a frequency band which is very narrow by comparison with the band width of the filter formed by the acoustic line.

The elastic surface wave device according to the invention enables parasitic waves to be eliminated over a band width similar to that of the filter formed by the surface wave line.

According to the invention, an elastic surface wave transmitting device comprises a piezoelectric substrate and electromechanical transducer means arranged on the surface of said substrate and enabling energy to be selectively transferred by elastic surface waves, said transducer means comprising:

a transmitting transducer arranged at the centre of said substrate and including a pair of interdigitated comb-type electrodes;

phase shift means enabling the surface wave transmitted by the transmitting transducer towards one of the receiving transducers to be phase shifted by $\pi/2$.

Figure 2:
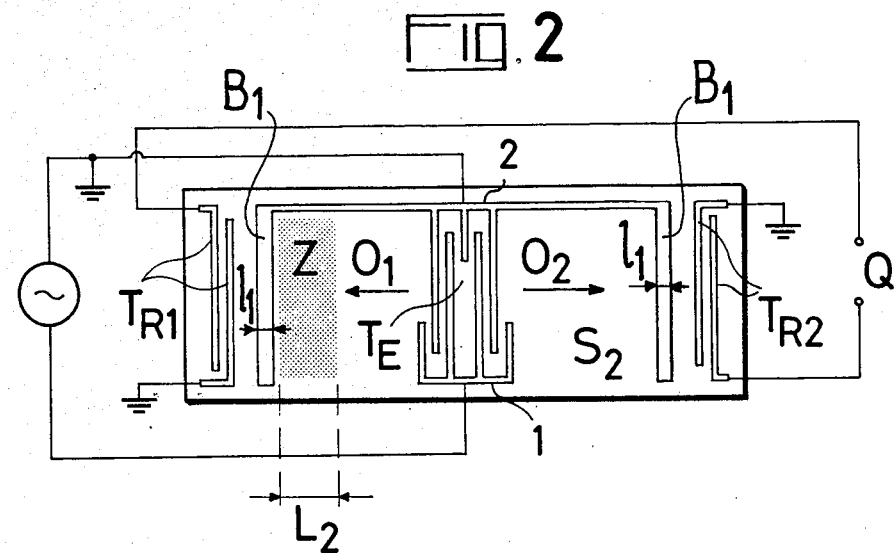
Figure 3:
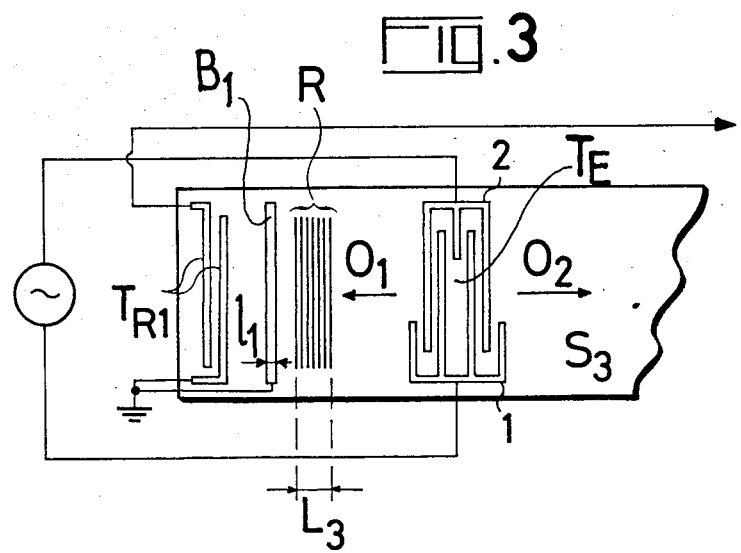

For the better understanding of the invention and to show how the same may be carried into effect, reference will be made to the drawing accompanying the insuing description and in which: FIGS. 1, 2 and 3 show three embodiments of an elastic surface wave device according to the invention.

The elastic surface wave device according to the invention as illustrated in FIG. 1 comprises:

a substrate $S_1$ of piezoelectric material (lithium niobate for example);

a transmitting transducer $T_E$ arranged at the centre of the substrate $S_1$ and comprising two electrodes 1 and 2 forming two interdigitated combs with fingers of unequal lengths;

two receiving transducers $T_{R1}$ and $T_{R2}$ consisting respectively of electrodes 3, 4 and 5, 6, these electrodes being connected to a load Q so that, at the receiving transducers $T_{R1}$ and $T_{R2}$, the waves $O_1$ and $O_2$ transmitted in two opposite directions by the transmitting transducer $T_E$ are in phase in the absence of any obstacle;

phase-shift means arranged between the transmitting transducer $T_E$ and one of the receiving transducers $T_{R1}$ or $T_{R2}$ ($T_{R1}$ in FIG. 1) and introducing a phase shift of $\pi/2$ between the incident waves arriving respectively at the receiving transducers $T_{R1}$ and $T_{R2}$, and another phase-shift of $\pi/2$ between the waves reflected by those transducers so that these waves $O_1$ and $O_2$ are in phase opposition at the transmitting receiver $T_E$ and cancel one another out.

These phase-shift means may be embodied in different ways. Three exemplary embodiments of these phase-shift means are described in the following.

In the first embodiment shown in FIG. 1, the phase-shift of the wave $O_1$ relative to the wave $O_2$ is obtained by an electrically conductive thin-plate $P_1$ arranged on the substrate $S_1$ between the transmitting transducer $T_E$ and the receiving transducer $T_{R1}$.

This thin plate $P_1$ may be a thin metallic layer (of aluminum or gold for example) vacuum deposited on to the substrate $S_1$, the substrate $S_1$ consisting, for example, of lithium niobate. The presence of this thin-plate $P_1$ introduces into the substrate $S_1$ a phase-shift:

$$\Delta \phi = 2\pi L f \left( \frac{1}{v} - \frac{1}{v_m} \right)$$

between the waves $O_1$ and $O_2$, $v$ being the traveling velocity of the wave $O_1$ in the substrate and $v_m$ being the traveling velocity of the wave $O_1$ in the metallised zone, i.e. in the thin-plate $P_1$, $f$ being the frequency of the waves $O_1$ and $O_2$.

The required phase-shift $\Delta \phi = \pi/2$ is obtained for a width L of the thin-plate $P_1$ equal to :

$$L = \frac{1}{4f \left( \frac{1}{v} - \frac{1}{v_m} \right)} \approx \frac{1}{4f} \cdot \frac{v^2}{\Delta v}$$

where $\Delta v = v_m - v$.

In operation, the wave $O_1$ is phase shifted by $\Delta \phi = \pi/2$ relative to the wave $O_2$ when these waves $O_1$, $O_2$ arrive at the receiving transducers $T_{R1}$ and $T_{R2}$, respectively. The wave $O_1$ undergoes another phase shift $\pi/2$ when, reflected by the receiving transducer $T_{R1}$, it retraverses the thin-plate $P_1$ so that the reflected waves $O_1$ and $O_2$ are in phase opposition when they arrive at the transmitting transducer $T_E$.

In order to avoid direct radiation between the transmitting transducer $T_E$ and the receiving transducer $T_{R2}$, an electrically conductive band B can be arranged between the transmitting transducer $T_E$ and the receiving transduer $T_{R2}$. The band B may be a thin layer of the same metal as used for the thin-plate $P_1$ (aluminum or gold for example). The band B forms an electrostatic screen which may be connected to earth like the thin-plate $P_1$.

If the width of the metallic band B made with same metal as used for the thin-plate $P_1$ is equal to $l$, the width $L_1$ of the phase-shift thin-plate $P_1$ must be equal to :

$$L_1 = L + l$$

in order to obtain the required phase shift $\Delta\phi = \pi/2$ between the waves $O_1$ and $O_2$ arriving at the receiving transducers $T_{R1}$ and $T_{R2}$, respectively.

In a second embodiment, the substrate (substrate $S_2$ in FIG. 2) consists of a plate of monocrystalline quartz and the phase-shift means is formed by ion bombardment of the substrate $S_2$ in a zone Z of predetermined width $L_2$. In this zone Z implanted with ions, situated between the transmitting transducer $T_E$ and the receiving transducer $T_{R1}$, the quartz rendered amorphous has propagation characteristics different from the propagation characteristics of the cyrstalline quartz. In the amorphous quartz zone, the velocity $Va$ of propagation of the surface waves increases ($Va > Vc$), $Vc$ being the velocity of propagation in the crystalline quartz. A phase shift of $\Delta\phi = \pi/2$ is obtained if the width of the implanted zone is equal to:

$$L_2 = \frac{1}{4f} \cdot \frac{V^2c}{\Delta V}$$

with $\Delta V = Vc - Va$.

Accordingly, the wave $O_1$ undergoes two phase shifts of $\pi/2$ and, at the transmitting transducer $T_E$, is in phase opposition with the reflected wave $O_2$ so that they cancel one another out.

In a further embodiment (FIG. 3), the phase-shift means comprise a network R of valleys and peaks formed in a piezoelectric substrate $S_3$ along straight parallel lines perpendicular to the direction of propagation of the surface waves. The effect of mass variation created in the surface structure of the substrate introduces a variation in the propagation velocity of the elastic surface waves, the difference between the propagation velocities $V_r$ and $V$ in the treated and untreated substrate determining the width $L_3$ of the network R required for obtaining a phase shift of $\pi/2$ between the waves $O_1$ and $O_2$ arriving at the receiving transducers $T_{R1}$ and $T_{R2}$, respectively, and hence a phase shift of $\pi$ between the waves $O_1$ and $O_2$ respectively reflected by the reflecting transducers $T_{R1}$ and $T_{R2}$ and arriving at the transmitting reciever $T_E$. $L_3$ will be selected as follows :

$$L_3 \approx \frac{1}{4f} \cdot \frac{V_2}{\Delta V}$$

where $\Delta V = |V_r - V|$

In the last two embodiments, metal bands B forming screens are arranged in front of each of the receiving transducers $T_{R1}$ and $T_{R2}$ and may be connected to earth. These screening bands have an identical width $l_1$ (FIG. 2).

The elastic surface wave transmitting device according to the invention makes it possible to eliminate the "triple echoes" attributable to the repeated reflection of the waves at the receiving transducers $T_{R1}$ and $T_{R2}$ within a relatively wide frequency band (approximately 10% of the average transmitted frequency). A device of this kind may be used with advantage for producing television filters of which the band width $\Delta f$ is of the order of one tenth of the average transmitted frequency $f_0$.

I claim:

1. An elastic surface wave transmitting device comprising a piezoelectric substrate and electromechanical transducer means arranged on the surface of said substrate, said means exchanging within an operating frequency range elastic surface wave energy, said transducer means comprising:
    a transmitting transducer arranged at the centre of said substrate and including a pair of interdigitated comb-type electrodes; for radiating said elastic surface wave energy in opposite directions
    two receiving transducers symmetrically arranged on either side of said transmitting transducer and respectively including a pair of interdigitated comb-type electrodes for receiving said elastic surface wave energy;
    phase-shift means causing the elastic surface wave transmitted by the transmitting transducer towards one of the receiving transducers to be substantially phase-shifted by $\pi/2$ for those frequencies lying within said operating frequency range.

2. An elastic surface wave transmitting device as claimed in claim 1, wherein the electrodes of the two receiving transducers are arranged and connected in such a way that the receiving transducers are in phase in the absence of any obstacle between the transmitting transducer and said receiving transducers.

3. An elastic surface wave transmitting device as claimed in claim 2, wherein said phase shift means comprise a metallic thin-plate of width L equal to:

$$L = \frac{1}{4f\left(\frac{1}{v} - \frac{1}{v_m}\right)} \approx \frac{1}{4f} \cdot \frac{v^2}{\Delta v}$$

where:
    $v$ is the velocity of propagation of the elastic surface wave in the substrate;
    $v_m$ is the velocity of propagation of the elastic surface wave in the substrate provided with the thin-plate;
    $\Delta v = |v_m - v|$
    $f$ is the average frequency of the elastic surface wave within said operating frequency range; said thin-plate being arranged on said substrate between the transmitting transducer and one of the receiving transducers and causing a phase shift substantially equal to $\pi/2$ to be introducted for the incident wave and the wave reflected by said receiving transducer so that the waves reflected by each of the receiving transducers are received in phase opposition at the transmitting transducer and cancel one another out.

4. An elastic surface wave transmitting device as claimed in claim 3, wherein said substrate consists of lithium niobate.

5. An elastic surface wave transmitting device as claimed in claim 2, wherein said substrate is made of monocyrstalline quartz, said phase-shift means being obtained by ion bombardment of said substrate which is converted into amorphous quartz in a zone of width $$L_2 = \frac{1}{4} \cdot \frac{1}{f} \cdot \frac{Vc^2}{\Delta V},$$

$Vc$ being the velocity of propagation of said elastic wave in the monocrystalline substrate, $Va$ being the velocity of propagation in the amorphous quartz and $\Delta V = |Va - Vc|$ 6. An elastic surface wave transmitting device as claimed in claim 2, wherein said phase-shift means are obtained by erosion of said substrate along parallel lines perpendicular to the direction of propagation of the elastic surface wave to be phase-shifted, the network formed by these erosion lines having a width $$L_3 = \frac{1}{4f} \cdot \frac{V_r^2}{\Delta V}$$

$V$ being the propagation velocity of the elastic surface wave in the piezoelectric substrate, $V_r$ being the propagation velocity in the network and $\Delta V = |V_r - v|$.

7. An elastic surface wave transmitting device as claimed in claim 3, further including a metallic screening band of width $l$ which is arranged on said substrate between the transmitting transducer and one of the receiving transducers, and wherein the width of said thin-plate is equal to:

$$L_1 = L + l.$$

8. An elastic surface wave transmitting device as claimed in claim 5, further including two metallic screening bands of the same width which are respectively arranged on either side of the transmitting transducer in front of the receiving transducers.

9. An elastic surface wave transmitting device as claimed in claim 6, further including two metallic screening bands of the same width which are respectively arranged an either side of the transmitting transducer in front of the receiving transducer.

* * * * *